(12) United States Patent
Lustig et al.

(10) Patent No.: US 6,600,200 B1
(45) Date of Patent: Jul. 29, 2003

(54) MOS TRANSISTOR, METHOD FOR FABRICATING A MOS TRANSISTOR AND METHOD FOR FABRICATING TWO COMPLEMENTARY MOS TRANSISTORS

(75) Inventors: Bernhard Lustig, München (DE); Herbert Schäfer, München (DE); Lothar Risch, Neubiberg (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/645,762

(22) Filed: Aug. 25, 2000

(30) Foreign Application Priority Data

Aug. 25, 1999  (DE) .......................... 199 40 362

(51) Int. Cl.⁷ .......................... H01L 29/06; H01L 29/76
(52) U.S. Cl. .................. 257/371; 257/344; 257/340; 257/22; 257/27; 257/336; 257/327
(58) Field of Search .................. 257/371, 344, 257/340, 22, 27, 336, 327, 328

(56) References Cited

U.S. PATENT DOCUMENTS 5,362,981 A * 11/1994 Sato et al. .............. 257/371
5,675,172 A * 10/1997 Miyamoto et al. .......... 257/402
5,773,863 A *  6/1998 Burr et al. ............. 257/344
5,804,497 A *  9/1998 Gardner et al. ............ 438/529
6,137,148 A * 10/2000 Gehrmann et al. ......... 257/394

OTHER PUBLICATIONS

T. Ohguro et al.: "Tenth Micron P–MOSFET's With Ultra–Thin Epitaxial Channel Layer Grown By Ultra–High-Vacuum CVD", *IEDM 93*, pp. 433–436.

L. Risch et al.: "Channel Engineering Using RP–CVD Epitaxy for High Performance CMOS Transistors", *Proc. ESSDERC, 1996*, pp. 321–324.

Thomas Skotnicki: "Advanced Architectures for 0.18–0.12 μm CMOS Generations", *Proc. ESSDERC, 1996*, pp. 505–514.

* cited by examiner

*Primary Examiner*—Eddie Lee
*Assistant Examiner*—Joseph Nguyen
(74) *Attorney, Agent, or Firm*—Laurence A. Greenberg; Werner H. Stemer; Ralph E. Locher

(57) ABSTRACT

A MOS transistor and a method for fabricating the same include producing a well doped by a first conductivity type in a semiconductor substrate. An epitaxial layer having a dopant concentration of less than $10^{17}$ cm$^{-3}$ is disposed on a surface of the doped well. Source/drain regions doped by a second conductivity type, opposite to the first conductivity type, and a channel region, are disposed in the epitaxial layer, and their depth is less than or equal to the thickness of the epitaxial layer. A method for fabricating two complementary MOS transistors is also provided.

4 Claims, 2 Drawing Sheets

MOS TRANSISTOR, METHOD FOR FABRICATING A MOS TRANSISTOR AND METHOD FOR FABRICATING TWO COMPLEMENTARY MOS TRANSISTORS

BACKGROUND OF THE INVENTION

Field of the Invention

The invention relates to a MOS transistor, a method for fabricating a MOS transistor and a method for fabricating two complementary MOS transistors.

During the development of short-channel MOS transistors, measures have to be taken to suppress short-channel effects such as VT rolloff, drain induced barrier lowering or punch-through effects and at the same time to ensure a sufficiently high threshold voltage for the transistors having a gate dielectric thickness that decreases with channel length.

It has been proposed (for example in the following papers: Proc. ESSDERC 1996, pp. 505–514, by T. Skotnicki; IEDM Tech. Digest 1993, pp. 433–436, by T. Ohguro et al.; and Proc. ESSDERC 1996, pp. 321–324, by L. Risch et al.), for the purpose of improving DC parameters, in particular charge carrier mobility in the channel region, in the case of short-channel transistors on conventional semiconductor substrates, to reduce a contribution of a vertical electric field in the channel region. The vertical effective field in the channel region greatly determines the charge carrier mobility. Reducing the vertical field necessitates reducing the dopant concentration in the channel region. However, that in turn increases the influence of the transverse drain field and leads to undesirable short-channel effects.

To that end, it has been proposed to realize the MOS transistor on a relatively highly doped semiconductor substrate with a dopant concentration of about $10^{18}$ cm$^{-3}$ and to provide a 20 to 50 nm thin undoped epitaxial layer in the channel region. In that case, care must be taken in the fabrication process to ensure that the relatively high doping does not diffuse out from the semiconductor substrate into the channel region. The source/drain regions project right into the highly doped substrate. Since the influence of the dopant concentration in the channel region on the threshold voltage decreases greatly with the distance from the gate dielectric, an adequate threshold voltage cannot be achieved in the case of that proposal with polysilicon as gate electrode material. The use of new gate materials, for example SiGe, is therefore necessary.

A further disadvantage of that proposal is that steep dopant gradients do not concomitantly scale to a sufficient extent when the size of the structure is reduced further. As a result, the increase in the current in the on state of the transistor becomes smaller and smaller.

As an alternative, it has been proposed to realize short-channel MOS transistors in SOI substrates, which have an insulating layer and a monocrystalline silicon layer on a support wafer. The active regions of those transistors are realized in the monocrystalline silicon layer. The capacitances of the source/drain regions with respect to the substrate are thereby reduced. One disadvantage of that alternative is in the high price of the SOI substrates and the high defect density in the monocrystalline silicon layer of SOI substrates.

SUMMARY OF THE INVENTION

It is accordingly an object of the invention to provide a MOS transistor, a method for fabricating a MOS transistor and a method for fabricating two complementary MOS transistors, which overcome the hereinafore-mentioned disadvantages of the heretofore-known devices and methods of this general type and which provide a MOS transistor that can be realized as a short-channel MOS transistor with improved CMOS gate transit times and an improved output current.

With the foregoing and other objects in view there is provided, in accordance with the invention, a MOS transistor, comprising a semiconductor substrate; a well doped by a first conductivity type in the semiconductor substrate, the doped well having a surface; an epitaxial layer having a dopant concentration of less than $10^{17}$ cm$^{-3}$ and a given thickness, the epitaxial layer disposed on the surface of the doped well; source/drain regions doped by a second conductivity type opposite to the first conductivity type, the source/drain regions disposed in the epitaxial layer, and the source/drain regions having a depth less than or equal to the given thickness; and a channel region disposed in the epitaxial layer.

With the objects of the invention in view, there is also provided a method for fabricating a MOS transistor, which comprises producing a well doped by a first conductivity type in a semiconductor substrate; growing an epitaxial layer with a given thickness and a dopant concentration of less than $10^{17}$ cm$^{-3}$ on a surface of the doped well; producing a gate dielectric on a surface of the epitaxial layer; producing a gate electrode on a surface of the gate dielectric; and producing source/drain regions doped by a second conductivity type opposite to the first conductivity type with a depth less than or equal to the given thickness, in the epitaxial layer.

The term "depth" is used herein to designate an extent perpendicular to the surface of the epitaxial layer, measured from the surface of the epitaxial layer.

Since the source/drain regions are disposed in the weakly doped epitaxial layer in the MOS transistor, the capacitance of the source/drain regions is considerably reduced. Therefore, the MOS transistor exhibits improved gate transit times and an improved output current at a driving voltage of 0 volts. When the substrate is connected up in a comparable manner, the MOS transistor is comparable, with regard to speed, with a MOS transistor which is realized in the monocrystalline silicon layer of an SOI substrate.

In particular, a monocrystalline silicon wafer is suitable as the semiconductor substrate.

In accordance with another feature of the invention, in order to fabricate a MOS transistor with a channel length of less than 130 nm, it is advantageous to choose the thickness of the epitaxial layer to be between 100 and 200 nm.

In accordance with a further feature of the invention, a doped layer having a depth which is smaller than the depth of the source/drain regions, having a thickness which is smaller than the thickness of the epitaxial layer and which is doped by the first conductivity type, that is to say by the same conductivity type as the doped well, is disposed in the epitaxial layer between the source/drain regions. The threshold voltage of the MOS transistor is set by the provision of the doped layer. In this way, a sufficiently high threshold voltage can be obtained even with a very thin gate dielectric.

The term "depth" of the source/drain regions is used herein to designate the distance between the surface of the epitaxial layer and the interface between the source/drain regions and the semiconductor material of the epitaxial layer, perpendicular to the surface of the epitaxial layer.

In accordance with an added feature of the invention, the doped layer is disposed at a depth of between 10 and 50 nm.

It preferably has a thickness of between 10 and 50 nm. The dopant concentration is preferably between $5\times10^{17}$ and $5\times10^{18}$ cm$^{-3}$. The thickness of the gate dielectric is preferably between 2 and 4 nm.

In accordance with an additional feature of the invention, with regard to suppressing punch-through effects, it is advantageous for a further layer doped by the first conductivity type to be disposed underneath the first-mentioned doped layer. In this case, the further doped layer may be disposed not only in the epitaxial layer but also at the interface between the highly doped well and the epitaxial layer.

In accordance with yet another feature of the invention, the further doped layer is disposed at a depth of between 50 and 200 nm and has a thickness of between 10 and 50 nm. The dopant concentration in the further doped layer is preferably $10^{17}$ to $5\times10^{18}$ cm$^{-3}$.

In order to fabricate the MOS transistor, firstly the well doped by the first conductivity type is produced in the semiconductor substrate. The epitaxial layer is grown on the surface of the doped well. The epitaxial layer is preferably grown undoped. The grown epitaxial layer is actually weakly doped as a result of contaminants situated, as a rule, in the epitaxy reactor. It has a dopant concentration of less than $10^{17}$ cm$^{-3}$.

A gate dielectric and a gate electrode are produced on the surface of the epitaxial layer. Source/drain regions doped by a second conductivity type, which is opposite to the first conductivity type, are produced in the epitaxial layer. The depth of the source/drain regions is smaller than the thickness of the epitaxial layer.

In accordance with another mode of the invention, in order to obtain a sharply delimited doped layer, which is often referred to by experts as a delta-doped layer, it is advantageous to produce the doped layer through the use of in situ-doped epitaxy during the growth of the epitaxial layer at the desired depth.

In accordance with a further mode of the invention, as an alternative, the doped layer may be produced by implantation through the gate dielectric. This has the advantage of ensuring that the profile of the doped layer is not blurred during the product-ion of the gate dielectric, in the course of which a thermal oxidation is usually carried out.

In accordance with an added mode of the invention, a further doped layer is produced underneath the first-mentioned doped layer. That further doped layer is preferably produced by implantation after the fabrication of the doped well and before the growth of the undoped epitaxial layer.

In accordance with an additional mode of the invention, in order to fabricate complementary MOS transistors, firstly a first doped well and a second doped well are formed. The first doped well is doped by the first conductivity type and is intended to accommodate a first MOS transistor, and the second doped well is doped by the second conductivity type and is intended to accommodate a second MOS transistor, which is complementary to the first MOS transistor. A common epitaxial layer for the two complementary MOS transistors, which has a dopant concentration of less than $10^{17}$cm$^{-3}$, is grown on the surface of the first doped well and of the second doped well. A gate dielectric is produced on the surface of the epitaxial layer. With regard to an optimized boundary layer between the epitaxial layer and the gate dielectric with respect to little surface roughness, it is advantageous to apply the gate dielectric directly after the epitaxial layer has been grown. A first gate electrode and a second gate electrode are produced on the surface of the gate dielectric. First source/drain regions doped by the second conductivity type and second source/drain regions doped by the first conductivity type are produced in the epitaxial layer. The depth of the source/drain regions is less than or equal to the thickness of the epitaxial layer.

In accordance with yet another mode of the invention, in order to provide for the mutually independent setting of the threshold voltages of the complementary transistors, it is advantageous for a first doped layer, which is doped by the first conductivity type, to be formed above the first well and a second doped layer, which is doped by the second conductivity type, to be formed above the second well.

In accordance with a concomitant mode of the invention, in order to avoid punch-through effects, it is advantageous for the further doped layer to be formed underneath the first doped layer and the second doped layer. The conductivity type of the further doped layer depends on whether punch-through effects are more likely to be feared in the case of the first MOS transistor or in the case of the second MOS transistor.

Other features which are considered as characteristic for the invention are set forth in the appended claims.

Although the invention is illustrated and described herein as embodied in a MOS transistor, a method for fabricating a MOS transistor and a method for fabricating two complementary MOS transistors, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
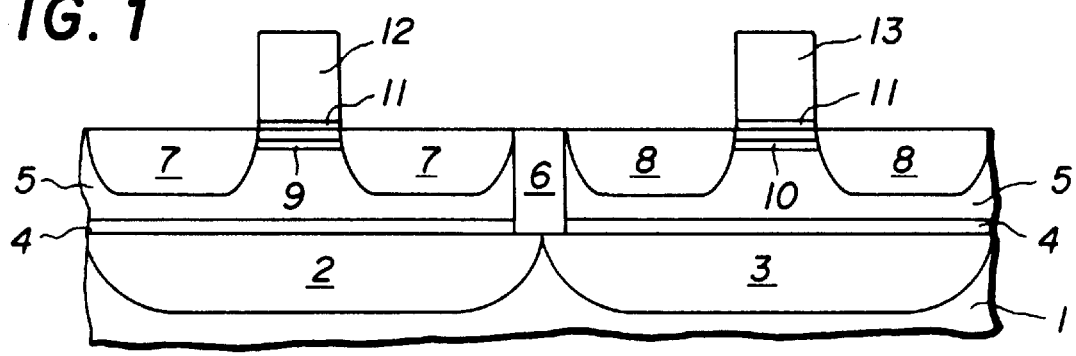
FIG. 1 is a fragmentary, diagrammatic, sectional view of a semiconductor substrate having a first MOS transistor and a second MOS transistor which is complementary to the latter.

Referring now to the figures of the drawings in detail and first, particularly, to FIG. 1 thereof, there is seen a p-doped well 2 and an n-doped well 3 disposed in a semiconductor substrate 1. The semiconductor substrate 1 is a monocrystalline silicon wafer having a base doping of $10^{15}$ to $10^{17}$ cm$^{-3}$. An anti-punch layer 4 seen in FIG. 1, which is disposed at an upper region of the p-doped well 2 and of the n-doped well 3, is n-doped with a dopant concentration of, for example, $5\times10^{17}$ cm$^{-3}$.

The dopant concentration in the p-doped well 2 is $3\times10^{17}$ cm$^{-3}$ of boron. The dopant concentration in the n-doped well 3 is $2\times10^{17}$ cm$^{-3}$ of phosphorus.

An undoped epitaxial layer 5 is disposed above the anti-punch layer 4. The undoped epitaxial layer 5 has a dopant concentration of less than $10^{17}$ cm$^{-3}$.

An isolation trench 6 reaches from the surface of the epitaxial layer 5 down into the semiconductor substrate 1. The isolation trench 6 defines active regions for a first MOS transistor which has an n-conducting channel region, and a second MOS transistor which has a p-conducting channel region.

It is seen that n-doped source/drain regions 7 for the first MOS transistor and p-doped source/drain regions 8 for the second MOS transistor are provided in the epitaxial layer 5. The n-doped source/drain regions 7 and the p-doped source/drain regions 8 respectively have an LDD profile (Lightly Doped Drain) and an HDD profile (Highly Doped Drain). In this case, the dopant concentration in the n-doped source/drain regions 7 is $10^{18}$ to $10^{19}$ cm$^{-3}$ of arsenic for the LDD profile and >$10^{20}$ cm$^{-3}$ of arsenic for the HDD profile. In the p-doped source/drain regions 8, the dopant concentration is $10^{18}$ to $10^{19}$ cm$^{-3}$ of $BF_2$ for the LDD profile and >$10^{20}$ cm$^{-3}$ of boron for the HDD profile.

A p-doped layer 9 having a dopant concentration of $10^{18}$ cm$^{-3}$ of boron is disposed between the n-doped source/drain regions 7 in the region of the first MOS transistor.

An n-doped layer 10 having a dopant concentration of $10^{18}$ cm$^{-3}$ of arsenic is disposed between the p-doped source/drain regions 8 in the region of the second MOS transistor.

A gate dielectric 11 containing nitrided $SiO_2$ with a layer thickness of from 2 to 4 nm is disposed on the surface of the epitaxial layer 5 between the n-doped source/drain regions 7 and between the p-doped source/drain regions 8.

A gate electrode 12 containing n$^+$-doped polysilicon and titanium silicide is disposed above the gate dielectric 11 in the region of the first MOS transistor. A gate electrode 13 containing p$^+$-doped polysilicon and titanium silicide is disposed on the surface of the gate dielectric 11 in the region of the second MOS transistor.

The p-doped layer 9 is disposed at a distance of from 10 to 50 nm from an interface between the gate dielectric 11 and the epitaxial layer 5 and has a thickness of from 10 to 50 nm. The n-doped layer 10 is disposed at a distance of from 10 to 50 nm from an interface between the gate dielectric 11 and the epitaxial layer 5. It also has a thickness of from 10 to 50 nm.

Figure 2:
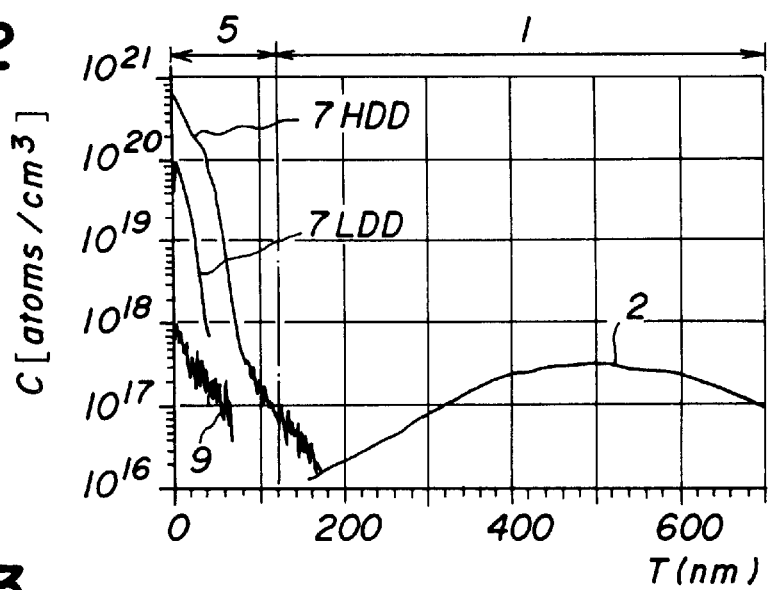
FIG. 2 is a graph showing dopant profiles in the first MOS transistor.
Figure 3:
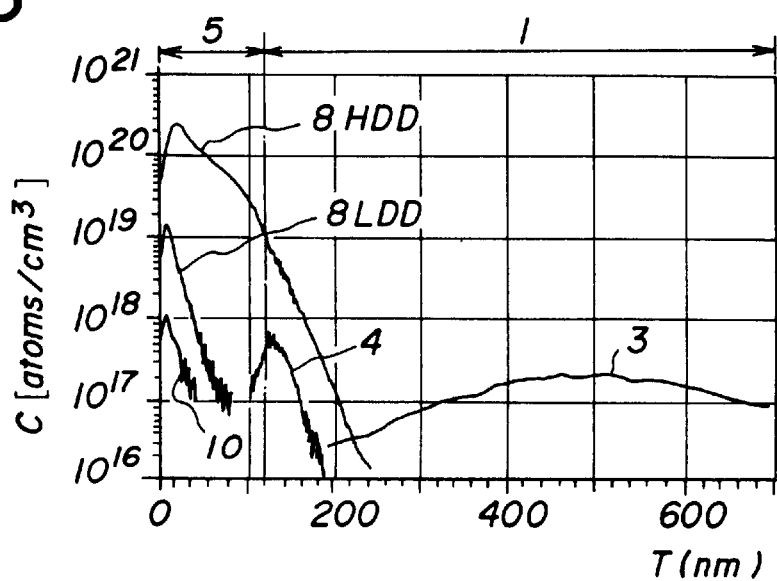
FIG. 3 is a graph showing dopant profiles in the second MOS transistor.
Figure 4:
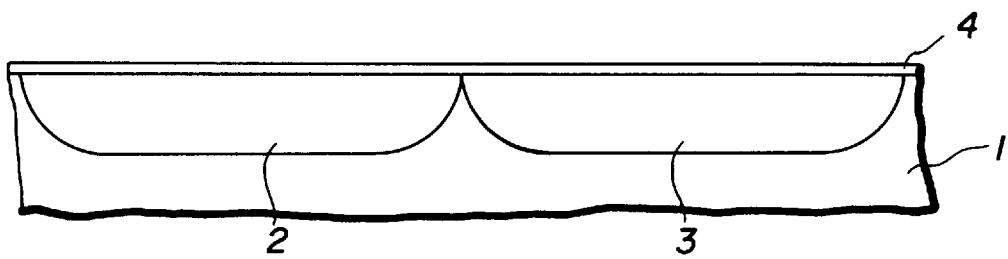
FIGS. 4 to 6 are fragmentary, sectional views showing fabrication steps for fabricating the first MOS transistor and the second MOS transistor.

FIG. 2 illustrates dopant concentration profiles of the first MOS transistor and FIG. 3 illustrates those of the second MOS transistor. In each case, a dopant concentration C is illustrated as a function of a depth T, that is to say a perpendicular distance from the interface between the gate dielectric 11 and the epitaxial layer 5. The extent of the undoped epitaxial layer 5 and of the semiconductor substrate 1 are depicted as double arrows at the top edge of the graphs. The dopant profiles in each case are designated by the reference symbol of the associated transistor region.

In order to fabricate the MOS transistor, the p-doped well 2 is formed in the semiconductor substrate 1 by masked implantation with boron having an energy of 120 keV and a dose of $10^{13}$ cm$^{-2}$. The n-doped well 3 is formed by masked implantation with phosphorus having an energy of 250 keV and a dose of $10^{13}$ cm$^{-3}$. During the implantation of the p-doped well 2, a mask is used which covers the region outside the p-doped well 2. During the implantation of the n-doped well 3, a mask is used which covers the region outside the n-doped well 3.

Arsenic implantation with an energy of 10 keV and a dose of $3\times10^{12}$ cm$^{-3}$ is subsequently carried out without the use of a mask. The anti-punch layer 4 is formed in the course of that implantation.

The implanted dopants are subsequently activated in a rapid heat-treatment step (RTA).

Figure 5:
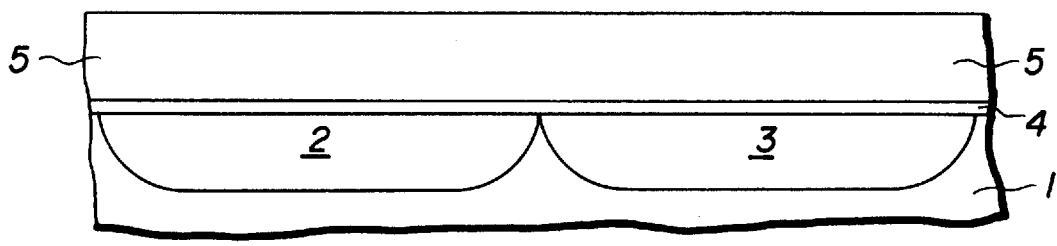

After the surface of the semiconductor substrate 1 has been cleaned, the undoped epitaxial layer 5 is grown to a layer thickness of 100 nm in a CVD (Chemical Vapor Deposition) reactor, as is shown in FIG. 5.

Figure 6:
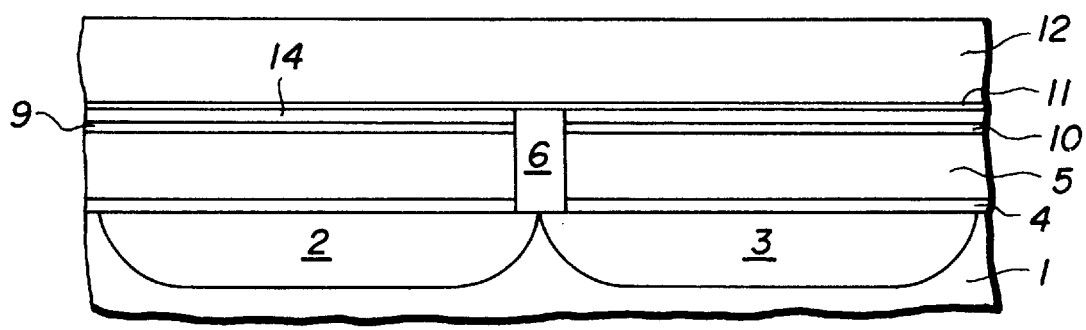

In order to produce the isolation trench 6, a trench is etched in the epitaxial layer 5 and filled with insulating material, e.g. $SiO_2$, as is seen in FIG. 6. The isolation trench 6 reaches down into the region of the p-doped well 2 and of the n-doped well 3. It thus cuts through the epitaxial layer 5 and the anti-punch layer 4.

The gate dielectric 11 and a polysilicon layer 14 are applied to the surface of the structure. The p-doped layer 9 is produced above the p-doped well 2 by masked implantation during which the region outside the p-doped well 2 is covered. The implantation is effected by using boron with an energy of 20 keV and a dose of $10^{13}$ cm$^{-3}$. The n-doped layer 10 is subsequently produced above the n-doped well 3 in the epitaxial layer 5 by masked implantation during which the region outside the n-doped well 3 is covered by a mask. The implantation is effected by using arsenic with an energy of 180 keV and a dose of $10^{13}$ cm$^{-3}$.

The first MOS transistor and the second MOS transistor are completed by patterning the polysilicon layer 14 and the gate dielectric 11 and by masked implantations for fabricating the n-doped source/drain regions 7 and the p-doped source/drain regions 8. The gate electrode 12 is n$^+$-doped and the gate electrode 13 is p$^+$-doped in the source/drain implantations.

We claim:

1. A MOS transistor, comprising:
    a semiconductor substrate;
    a well doped by a first conductivity type in said semiconductor substrate, said doped well having a surface;
    an epitaxial layer having a dopant concentration of less than $10^{17}$ cm$^{-3}$ and a given thickness, said epitaxial layer disposed on said surface of said doped well;
    source/drain regions doped by a second conductivity type opposite to said first conductivity type, said source/drain regions disposed in said epitaxial layer, and said source/drain regions having a depth at most equal to said given thickness;
    a channel region disposed in said epitaxial layer;
    a first doped layer doped by said first conductivity type and disposed in said epitaxial layer between said source/drain regions, said first doped layer having a depth smaller than said depth of said source/drain regions and a thickness smaller than said given thickness of said epitaxial layer; and
    a second doped layer doped by said first conductivity type and disposed underneath said first doped layer in said epitaxial layer.

2. The MOS transistor according to claim 1, wherein said given thickness of said epitaxial layer is between 100 and 200 nm.

3. The MOS transistor according to claim 1, wherein said doped layer is disposed at a depth of between 10 and 50 nm, has a thickness of between 10 and 50 nm and has a dopant concentration of between $5\times10^{17}$ and $5\times10^{18}$ cm$^{-3}$.

4. The MOS transistor according to claim 1, wherein said second doped layer is disposed at a depth of between 50 and 200 nm, has a thickness of between 10 and 50 nm and has a dopant concentration of between $10^{17}$ and $5\times10^{18}$ cm$^{-3}$.

* * * * *